United States Patent
Takayama et al.

(10) Patent No.: US 7,539,230 B2
(45) Date of Patent: May 26, 2009

(54) SEMICONDUCTOR LASER DEVICE AND METHOD FOR FABRICATING THE SAME

(75) Inventors: Toru Takayama, Nara (JP); Tomoya Satoh, Osaka (JP); Koichi Hayakawa, Okayama (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 33 days.

(21) Appl. No.: 11/882,173

(22) Filed: Jul. 31, 2007

(65) Prior Publication Data
US 2008/0043797 A1 Feb. 21, 2008

(30) Foreign Application Priority Data
Aug. 11, 2006 (JP) .............................. 2006-220216

(51) Int. Cl.
*H01S 5/00* (2006.01)
(52) U.S. Cl. ............. 372/50.121; 372/50.1; 372/46.016
(58) Field of Classification Search ................ 372/50.1, 372/50.121
See application file for complete search history.

(56) References Cited

U.S. PATENT DOCUMENTS

| 6,546,035 B2 | 4/2003 | Imafuji et al. |
| 2004/0095979 A1* | 5/2004 | Onishi et al. .................. 372/45 |
| 2005/0069005 A1* | 3/2005 | Nishida et al. ................ 372/50 |
| 2005/0271108 A1* | 12/2005 | Wada et al. .............. 372/50.12 |
| 2006/0233210 A1* | 10/2006 | Takayama ................ 372/43.01 |
| 2007/0019698 A1* | 1/2007 | Fukuhisa et al. ........ 372/50.121 |
| 2007/0091955 A1* | 4/2007 | Takayama ................ 372/43.01 |

FOREIGN PATENT DOCUMENTS

| JP | 03-209897 | 9/1991 |
| JP | 11-186651 | 7/1999 |
| JP | 11-243259 | 9/1999 |

(Continued)

OTHER PUBLICATIONS

Japanese Office Action, with English Translation, issued in Japanese Patent Application No. JP 2006-220216 dated on Apr. 8, 2008.

(Continued)

*Primary Examiner*—Minsun Harvey
*Assistant Examiner*—Phillip Nguyen
(74) *Attorney, Agent, or Firm*—McDermott Will & Emery LLP

(57) ABSTRACT

A semiconductor laser device includes a red-light-emission portion and an infrared-light-emission portion on a single substrate. The red-light-emission portion has a structure in which an AlGaInP-based active layer is sandwiched by a first cladding layer of a first conductivity type having a striped portion and a second cladding layer of a second conductivity type. The infrared-light-emission portion has a structure in which an AlGaAs-based active layer is sandwiched by a third cladding layer of the first conductivity type having a striped portion and a fourth cladding layer of the second conductivity type. The first, second, third, and fourth cladding layers are all made of an AlGaInP-based material. When in these layers, the Al:Ga contents are represented by X1:1-X1, X2:1-X2, X3:1-X3, and X4:1-X4, respectively, $X1 \geq X2$ and $X3 \geq X4$ are satisfied.

9 Claims, 9 Drawing Sheets

FOREIGN PATENT DOCUMENTS

| | | |
|---|---|---|
| JP | 2000-244060 | 9/2000 |
| JP | 2001-320132 | 11/2001 |
| JP | 2004-172199 | 6/2004 |
| JP | 2005-044993 | 2/2005 |
| JP | 2005-203048 | 7/2005 |
| JP | 2005-235865 | 9/2005 |
| JP | 2006-128295 | 5/2006 |
| JP | 2006-196846 | 7/2006 |

OTHER PUBLICATIONS

Japanese Office Action, with English Translation, issued in Japanese Patent Application No. JP 2006-220216 dated Jan. 27, 2009.

* cited by examiner

SEMICONDUCTOR LASER DEVICE AND METHOD FOR FABRICATING THE SAME

CROSS-REFERENCE TO RELATED APPLICATIONS

This application claims priority under 35 U.S.C. § 119 on Patent Application No. 2006-220216 filed in Japan on Aug. 11, 2006, the entire contents of which are hereby incorporated by reference.

BACKGROUND OF THE INVENTION (a) Fields of the Invention

The present invention relates to semiconductor laser devices. In particular, the present invention relates to semiconductor lasers which can emit light ranging from red to infrared and which are employed for light sources for pickups of optical disk devices, or light sources for other electronic devices and information-processing devices.

(b) Description of Related Art

At present, digital video disks (DVD) capable of high-density packing of information and mass storage and DVD drive devices for record and playback of the information therein are commercially available, and they receive attention as products whose demand will be further growing in the future. In order to provide high-density recording of information, the DVD uses, as a laser source for record and playback, an AlGaInP-based semiconductor laser with an emission wavelength of 650 nm. Thus, in the conventional DVD drive device, an optical pickup cannot play back information in a compact disk (CD) or a MiniDisc (MD) which uses for playback an AlGaAs-based semiconductor laser with an emission wavelength of 780 nm.

To address this disadvantage, an optical pickup is employed in which an AlGaInP-based semiconductor laser with an emission wavelength range of 650 nm and an AlGaAs-based semiconductor laser with an emission wavelength range of 780 nm are separately incorporated as laser chips into respective packages to mount the two lasers with different wavelengths therein. This provides a drive device capable of playing back information in any of DVDs, CDs, and MDs.

However, since the optical pickup as described above mounts the two packages composed of the AlGaInP-based semiconductor laser and the AlGaAs-based semiconductor laser, respectively, it has an increased size. Thus, a DVD drive device having such an optical pickup employed therein also has an increased size.

In contrast to this, an integrated semiconductor light-emitting device as disclosed in Japanese Unexamined Patent Publication No. H11-186651 is known which has light emission structures composed of semiconductor layers grown on a single substrate, respectively, and which has multiple types of semiconductor light-emitting elements with different emission wavelengths.

One example of the conventional integrated semiconductor light-emitting device thus constructed is shown in FIG. 9. Referring to FIG. 9, in the conventional integrated semiconductor laser device 100, on a single n-type GaAs substrate 101, an AlGaAs-based semiconductor laser LD1 with an emission wavelength range of 700 nm (for example, 780 nm) and an AlGaInP-based semiconductor laser LD2 with an emission wavelength range of 600 nm (for example, 650 nm) are integrated to be separated from each other.

In this structure, as the n-type GaAs substrate 101, use is made of, for example, a substrate having an orientation of (100) plane or using as a principal plane a surface, for example, 5 to 15° inclined from the (100) plane.

In the AlGaAs-based semiconductor laser LD1, on the n-type GaAs substrate 101, an n-type GaAs buffer layer 111, an n-type AlGaAs cladding layer 112, an active layer 113 with a single quantum well (SQW) structure or a multiple quantum well (MQW) structure, a p-type AlGaAs cladding layer 114, and a p-type GaAs cap layer 115 are sequentially stacked in this order from bottom to top.

The upper portion of the p-type AlGaAs cladding layer 114 and the p-type GaAs cap layer 115 are formed in a striped pattern extending in one direction. Both side parts of the striped portion are provided with n-type GaAs current narrowing layers 116, respectively, and they form a current narrowing structure. A p-side electrode 117 is provided on the p-type GaAs cap layer 115 in a striped pattern and the n-type GaAs current narrowing layer 116, and is in ohmic contact with the p-type GaAs cap layer 115. As the p-side electrode 117, for example, a Ti/Pt/Au electrode is used.

On the other hand, in the AlGaInP-based semiconductor laser LD2, on the n-type GaAs substrate 101, an n-type GaAs buffer layer 121, an n-type AlGaInP cladding layer 122, an active layer 123 with a SQW structure or a MQW structure, a p-type AlGaInP cladding layer 124, a p-type GaInP intermediate layer 125, and a p-type GaAs cap layer 126 are sequentially stacked in this order from bottom to top.

The upper portion of the p-type AlGaInP cladding layer 124, the p-type GaInP intermediate layer 125, and the p-type GaAs cap layer 126 are formed in a striped pattern extending in one direction. Both side parts of the striped portion are provided with n-type GaAs current narrowing layers 127, respectively, and they form a current narrowing structure. A p-side electrode 128 is provided on the p-type GaAs cap layer 126 in a striped pattern and the n-type GaAs current narrowing layer 127, and is in ohmic contact with the p-type GaAs cap layer 126. As the p-side electrode 128, for example, a Ti/Pt/Au electrode is used.

On the back surface of the n-type GaAs substrate 101, an n-side electrode 129 is provided to be in ohmic contact with the n-type GaAs substrate 101. As the n-side electrode 129, for example, an AuGe/Ni electrode or an In electrode is used.

The p-side electrode 117 of the AlGaAs-based semiconductor laser LD1 and the p-side electrode 128 of the AlGaInP-based semiconductor laser LD2 are soldered on a heat sink H1 and a heat sink H2, respectively, which are provided on a package base 200 to be electrically separated from each other.

With the conventional integrated semiconductor laser device 100 constructed as shown above, a current can be passed between the p-side electrode 117 and the n-side electrode 129 to drive the AlGaAs-based semiconductor laser LD1. Likewise, a current can be passed between the p-side electrode 128 and the n-side electrode 129 to drive the AlGaInP-based semiconductor laser LD2. Then, by driving the AlGaAs-based semiconductor laser LD1, a laser light with a wavelength range of 700 nm (for example, 780 nm) can be taken therefrom, and by driving the AlGaInP-based semiconductor laser LD2, a laser light with a wavelength range of 600 nm (for example, 650 nm) can be taken therefrom. Which of the AlGaAs-based semiconductor laser LD1 and the AlGaInP-based semiconductor laser LD2 is driven is switch-selectable with an external switch.

As described above, since the conventional integrated semiconductor laser device 100 has the AlGaAs-based semiconductor laser LD1 with an emission wavelength range of 700 nm and the AlGaInP-based semiconductor laser LD2 with an emission wavelength range of 600 nm, a laser light targeted for DVDs and a laser light targeted for CDs and MDs can be picked up independently. Therefore, by mounting the integrated semiconductor laser device 100 as a laser source on an optical pickup of a DVD drive device, it can record and play back information in any of DVDs, CDs, and MDs.

Since the AlGaAs-based semiconductor laser LD1 and the AlGaInP-based semiconductor laser LD2 have laser structures formed of the semiconductor layers grown on the single n-type GaAs substrate 101, the resulting integrated semiconductor laser device requires only one package. This downsizes the optical pickup and in turn downsizes the DVD drive device.

SUMMARY OF THE INVENTION

It is conceivable that in the future, a light source for a high-speed writable optical disk system, such as a 16× recordable DVD and a 48× recordable CD-R having not only the reading function but also the writing function, will increasingly grow in demand. In the case where the light source is used for such a purpose, a laser used thereas is required to perform a high output operation of at least 200 mW or more.

In general, in the case where a semiconductor laser is operated to provide high output, an end face (a front end face) of a resonator located at the side thereof for picking up laser light is coated with a dielectric film with a reflectivity as low as 10% or less. In addition to this, an opposite end face (a back end face) of the resonator is coated with a dielectric film with a reflectivity as high as 85% or more. Such antireflection (AR)/high reflection (HR) coating is applied to improve the external differential quantum efficiency (slope efficiency) of the current-optical output characteristics thereof, and thereby a high optical output is attained only by a small amount of injected current. In addition, the coating decreases the power density of the laser light onto the front end face during operation, whereby it prevents the occurrence of COD (Catastrophic Optical Damage), a phenomenon in which the end face of the laser is melted and broken by a laser light output from the laser itself.

When a high output operation providing a power of 200 mW or more is performed as described above, the AR/HR coating is applied to the end face of the resonator of the laser to decrease the power density of the light through a waveguide located at the front end face side for picking up the laser light. However, even in this case, COD is likely to occur. This results from the fact that due to its high output operation, heat generation accompanying an increase in power consumption and an increase in light absorption loss within the waveguide during operation shrinks the band gap of the active layer around the laser end face and then the laser light is absorbed at the laser end face. As a result of this, in the case of performing a high output operation providing a power of 200 mW or more, only application of the AR/HR coating cannot insure the reliability (in particular, the long-term reliability for more than several thousand hours).

Hence, an effective approach for preventing the occurrence of COD is probably that around the laser end face, a window region is formed which has a quantum well active layer disordered by diffusing impurities in the active layer. The reason for this is as follows.

The band gap of the active layer is initially made large around the laser end face (the window region) having impurities diffused therein, and it then becomes larger than the band gap of other portions of the active layer. As a result of this, even though heat generation during operation makes the band gap of the active layer small around the window region, the window region can be kept in a transparent state to the laser light. The wording "a transparent state to the laser light" means the state in which no laser light is absorbed because the wavelength corresponding to the band gap in the window region is greater than the wavelength of the laser light emitted. In addition, heat generation during operation indicates heat generation by the laser itself, heat generation by Auger recombination in the laser end face and light absorption loss within the band, and the like.

The structure having the above-mentioned window region provided therein is employed in the integrated semiconductor laser device for DVDs and CD-Rs (referred hereinafter to as a dual-wavelength semiconductor laser device), whereby a dual-wavelength light source for an optical disk system writable at high speed can be provided.

For a readable, writable optical disk system using the dual-wavelength semiconductor laser device for a light source, a single optical system is used to emit laser lights with two wavelengths, such as red light and infrared light. Thus, a lens contained in the optical system should be designed to optimize the light transmission efficiency thereof for both of red light and infrared light.

In the optical system of the optical disk system, a far-field radiation pattern (FFP) of the dual-wavelength semiconductor laser device has a great influence on the light transmission efficiency of the lens therein. As a concrete example, the optical system is designed more easily as the FFP of a red-light laser and the FFP of an infrared-light laser more closely approximate each other, and ideally the two FFPs are identical. Therefore, where the FFP is defined as, for example, a full width at half maximum, what is required is that the full width at half maximum of the red-light laser approaches the full width at half maximum of the infrared-light laser.

On the other hand, from the viewpoint of device fabrication, in fabricating the dual-wavelength semiconductor laser device, it is better that the red-light laser and the infrared-light laser are subjected to simultaneous formation of the respective window regions, simultaneous formation of respective ridges for current injection, and the like. This is because such procedures reduce the number of fabrication process steps to decrease the fabrication cost.

That is to say, it is desired that multiple light-emission portions for emitting lights having different wavelengths, respectively, such as the red-light laser and the infrared-light laser, achieve commonality of fabrication processes and also approach of their FFPs.

Moreover, in order to lower the power consumption for the element to suppress an increase in operating current due to heat generation by the element, it is necessary to provide a low-loss waveguide.

In view of the foregoing, the present invention provides: a dual-wavelength semiconductor laser device which is fabricated on a single substrate, is fabricated by a reduced number of fabrication steps, has multiple light-emission portions with nearly identical FFPs, and has low waveguide loss; and a method for fabricating such a device.

To be more specific, in a semiconductor laser device according to the present invention, a red-light-emission portion and an infrared-light-emission portion are provided on a single substrate, the red-light-emission portion has a double heterostructure in which a red-light-emitting active layer made of an InGaP-based material or an AlGaInP-based material is sandwiched by a first cladding layer made of an AlGaInP-based material of a first conductivity type and having a red-light-side striped portion for current injection and a second cladding layer made of an AlGaInP-based material of a second conductivity type, the infrared-light-emission portion has a double heterostructure in which an infrared-light-emitting active layer made of a GaAs-based material or an AlGaAs-based material is sandwiched by a third cladding layer made of an AlGaInP-based material of the first conductivity type and having an infrared-light-side striped portion for current injection and a fourth cladding layer made of an AlGaInP-based material of the second conductivity type, and when in the first cladding layer, the second cladding layer, the third cladding layer, and the fourth cladding layer, the Al:Ga contents are represented by X1:1-X1, X2:1-X2, X3:1-X 3, and X4:1-X4, respectively, $X1 \geq X2$ and $X3 \geq X4$ are satisfied.

Note that all of X1, X2, X3, and X4 are more than 0 and less than 1.

With the semiconductor laser device according to the present invention, $X1 \geq X2$ and $X3 \geq X4$ can be satisfied to reduce waveguide loss as will be described below.

First, in the case where in the light-emission portion with the double heterostructure, one cladding layer has a striped portion for current injection, one said cladding layer is generally thinner than the other cladding layer. This results from the following facts: when the cladding layer having the striped portion with the flowing current confined therein is thickened, the element resistance increases; the etching controllability should be enhanced in order to form thick striped portion; and the like.

Thus, if the optical field distribution in the light-emission portion in the perpendicular direction is tilted toward the cladding layer having the striped portion, light absorption loss is likely to occur, resulting in an increase in waveguide loss.

To avoid this trouble, $X1 \geq X2$ is satisfied to prevent the first cladding layer with the striped portion from having a higher refractive index than the second cladding layer. With this, the optical field distribution of the red-light-emission portion can be tilted toward the second cladding layer to reduce waveguide loss.

Likewise, by satisfying $X3 \geq X4$, the optical field distribution of the infrared-light-emission portion can also be tilted toward the fourth cladding layer to reduce waveguide loss.

Note that by satisfying $X1>X2$ and $X3>X4$, more significant effects can be provided desirably.

The AlGaInP-based material represents a material in which all of Al, Ga, In, and P are contained to have respective contents more than zero. Likewise, an InGaP-based material, an AlGaInP-based material, a GaAs-based material, or an AlGaAs-based material represents a material in which corresponding elements are contained to have contents more than zero.

Preferably, $X1 \geq X3$ and $X2 \geq X4$ are further satisfied.

With this device, between the red-light-emission portion emitting red laser light and the infrared-light-emission portion emitting infrared laser light, the difference in the full width at half maximum of the FFP can be reduced. The reason for this will be described below.

When the case where the first to fourth cladding layers are made of an AlGaInP-based material with the same composition is considered, the difference in the refractive index with respect to red laser light between the cladding layer and the active layer of the red-light-emission portion is smaller than the difference in the refractive index with respect to infrared laser light between the cladding layer and the active layer of the infrared-light-emission portion. This results from the wavelength difference between the red laser light and the infrared laser light and the material difference between the red-light-emitting active layer and the infrared-light-emitting active layer. Note that the cladding layer has a higher refractive index than the active layer. Thus, the angle of perpendicular divergence of the infrared-light laser becomes greater than the angle of perpendicular divergence of the red-light laser.

In general, the refractive index of the AlGaInP-based material becomes lower as the Al content relative to Ga is higher. Therefore, the Al contents of the AlGaInP-based materials of the first to fourth cladding layers are adjusted to satisfy $X1 \geq X3$, whereby the first cladding layer can be prevented from having a higher refractive index than the third cladding layer. Likewise, by satisfying $X2 \geq X4$, the second cladding layer can be prevented from having a higher refractive index than the fourth cladding layer.

With this device, the refractive index difference between the cladding layer and the active layer of the infrared-light-emission portion can be reduced to approach the refractive index difference between the cladding layer and the active layer of the red-light-emission portion.

As a result of this, the angle of perpendicular divergence of the infrared-light laser can approach the angle of perpendicular divergence of the red-light laser, and thereby the difference in the full width at half maximum of the FFP can be reduced therebetween.

Note that by satisfying $X1>X3$ and $X2>X4$, more significant effects can be provided desirably.

Preferably, $X1-X3 \leq 0.1$ is further satisfied. With this device, fabrication processes of the semiconductor laser device can be simplified. The reason for this will be described below.

First, if the above relation ($X1-X3 \leq 0.1$) is satisfied, the first cladding layer and the third cladding layer have relatively close Al contents. As a result of this, the first cladding layer and the third cladding layer have nearly the same reactivity to processes such as etching. Therefore, the first cladding layer and the third cladding layer can be subjected to an equal process for the same processing time. That is to say, for example, by simultaneously forming the red-light-side striped portion and the infrared-light-side striped portion at one process step, overetching can be avoided to reduce variations in the width and height of the ridge.

Moreover, in the case where impurity introduction is performed to form a window region around the end face of the resonator, the Al content of the cladding layer in which the impurity is to be diffused affects the impurity diffusion rate. Therefore, since the first cladding layer and the third cladding layer have close Al contents (which is indicated by $X1-X3 \leq 0.1$), the impurity diffusion rates of the respective cladding layers are almost the same. Thus, in the red-light-emission portion and the infrared-light-emission portion, the time necessary to diffuse the impurity to a required depth becomes almost the same, so that the window region can be formed at one process in both of the red-light-emission portion and the infrared-light-emission portion.

As described above, the above relation can be satisfied to reduce the number of process steps for fabricating a semiconductor laser device.

Furthermore, the red-light-emitting active layer and the infrared-light-emitting active layer each have a quantum well structure, and in at least one end face of a resonator contained in each of the red-light-emission portion and the infrared-light-emission portion, the red-light-emitting active layer and the red-light-emitting active layer are each provided with a window region in a disordered state made by impurity introduction.

The window region of the layer is transparent to laser light to be emitted, and thus absorption of the laser light is suppressed. Therefore, the presence of the window region can enhance the COD level to provide a good high output capability.

Preferably, the impurity includes at least one of Zn and Si. By using such a impurity, the quantum well active layer in a disordered state can be formed with a good repeatability, and thereby the window region can be formed reliably. As a result, a semiconductor laser device with laser light having a desired full width at half maximum of a FFP can be provided which prevents the occurrence of COD and which provides high output.

Preferably, the red-light-side striped portion and the infrared-light-side striped portion are formed of ridges in mesa shapes, respectively, and side walls of the ridges are formed with identical semiconductor layers, respectively.

With this device, in the red-light-emission portion and the infrared-light-emission portion, the side walls of the respective ridges in mesa shapes can be simultaneously formed with light confinement layers, respectively. This reduces the number of times crystal growth is performed, so that the processes for fabricating a semiconductor laser device are simplified.

Preferably, the semiconductor layers are AlInP current block layers.

Thereby, both of the red-light-emission portion and the infrared-light-emission portion are formed into semiconductor lasers with a real refractive index guided mechanism, and the operating current and the oscillation threshold current thereof can be reduced. Moreover, current injection from the striped portion can be carried out reliably.

Preferably, identical dielectric layers are formed instead of the identical semiconductor layers, respectively. With this, the real refractive index guided mechanism can also be realized in both of the red-light-emission portion and the infrared-light-emission portion, and the operating current and the oscillation threshold current of the semiconductor laser device can also be reduced.

Preferably, the dielectric layers include at least one of a SiN layer, a $SiO_2$ layer, a $TiO_2$ layer, an $Al_2O_3$ layer, and an amorphous silicon hydride layer. Alternatively, it may include the structure made by stacking some of these layers.

When the layer with such a structure is used as a concrete dielectric layer, the real refractive index guided mechanism can be realized reliably.

Next, a method for fabricating a semiconductor laser device according to the present invention in which a red-light-emission portion and an infrared-light-emission portion are provided on a substrate includes: the step (a) of forming a double heterostructure of the red-light-emission portion in which a red-light-emitting active layer made of an InGaP-based material or an AlGaInP-based material is sandwiched by a first cladding layer made of an AlGaInP-based material of a first conductivity type and a second cladding layer made of an AlGaInP-based material of a second conductivity type; the step (b) of forming a double heterostructure of the infrared-light-emission portion in which an infrared-light-emitting active layer made of a GaAs-based material or an AlGaAs-based material is sandwiched by a third cladding layer made of an AlGaInP-based material of the first conductivity type and a fourth cladding layer made of an AlGaInP-based material of the second conductivity type; the step (c) of introducing, after the steps (a) and (b), an impurity into predetermined regions of the red-light-emitting active layer and the infrared-light-emitting active layer, thereby forming window regions, respectively; and the step (d) of processing, after the steps (a) and (b), the first cladding layer and the third cladding layer to form a red-light-side striped portion and an infrared-light-side striped portion for current injection, respectively, and when in the first cladding layer, the second cladding layer, the third cladding layer, and the fourth cladding layer, the Al:Ga contents are represented by X1:1-X1, X2:1-X2, X3:1-X3, and X4:1-X4, respectively, $X1 \geq X2$ and $X3 \geq X4$ are satisfied.

Preferably, $X1 \geq X3$ and $X2 \geq X4$ are further satisfied.

With this method, the semiconductor laser device according to the present invention can be fabricated.

In this method, the red-light-side striped portion and the infrared-light-side striped portion can be formed in the same process, and also the respective window regions of the red-light-emission portion and the infrared-light-emission portion can be formed in the same process. In addition to this, the Al contents of the first to fourth cladding layers satisfy the above relations, whereby as has been mentioned in the description of the device, the difference in the full width at half maximum of the FFP can be reduced between the red-light laser and the infrared-light laser. Furthermore, in both of the red-light-emission portion and the infrared-light-emission portion, waveguide loss can be reduced.

As described above, with the present invention, a plurality of semiconductor lasers emitting lights with different wavelengths, such as red light and infrared light, can be integrated on a single substrate, and the difference in the full width at half maximum of the FFP among the respective lasers can be reduced in both of the horizontal and perpendicular directions. In addition to this, window regions and striped portions of two light-emission portions can be formed at one respective process, so that fabrication processes can be simplified.

BRIEF DESCRIPTION OF THE DRAWINGS

FIGS. 8A and 8B are views showing fabrication processes of the semiconductor laser device 1.

DETAILED DESCRIPTION OF THE PREFERRED EMBODIMENTS

A semiconductor laser device according to one embodiment of the present invention will be described below with reference to the accompanying drawings.

Figure 1A:
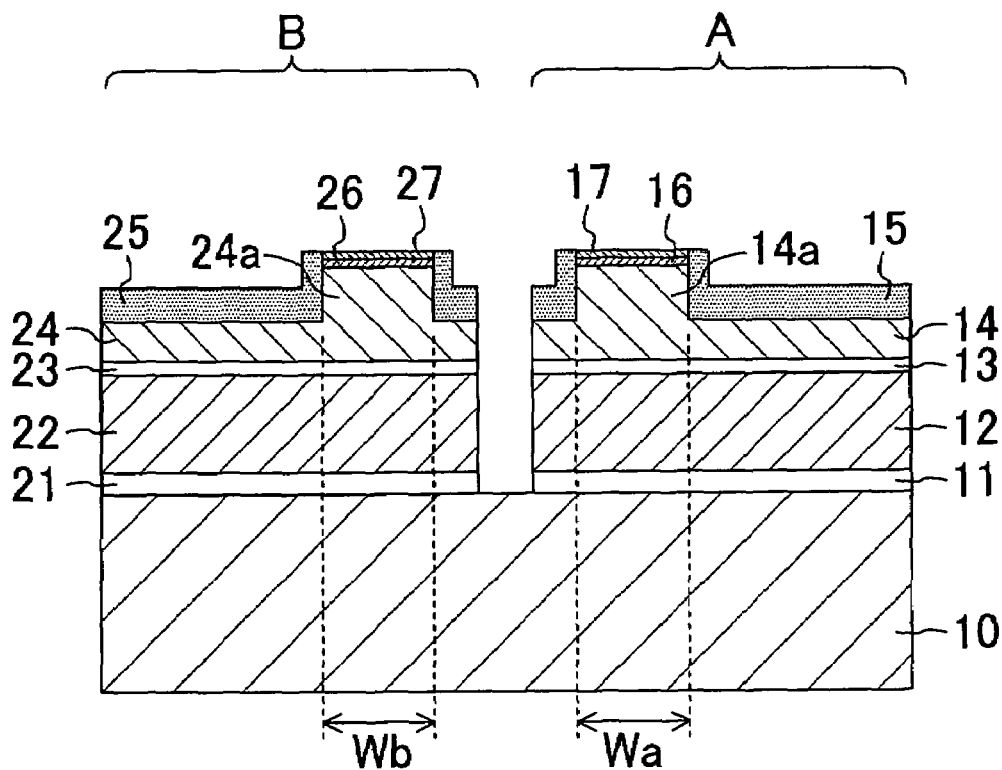
FIG. 1A is a view schematically showing a cross-sectional structure of a semiconductor laser according to one embodiment of the present invention.

FIG. 1A is a schematic view showing a cross-sectional structure of a semiconductor laser device 1 according to this embodiment.

In the semiconductor laser device 1, an n-type GaAs substrate 10 is provided which uses as a principal plane a surface made of n-type GaAs and 10 degrees inclined from the (100) plane toward the [011] direction. On the n-type GaAs substrate 10, a red-light laser A and an infrared-light laser B are integrated as two light-emission portions for emitting lights with different wavelengths. First description will be made of the structure of the red-light laser A.

The red-light laser A has the structure made by sequentially stacking, on the n-type GaAs substrate 10 in the following order from bottom to top, an n-type buffer layer 11 (0.5 µm-thick) made of n-type GaAs, an n-type cladding layer 12 (2.0 µm-thick) made of n-type $(Al_{X2}Ga_{1-X2})_{0.51}In_{0.49}P$, an active layer 13 with a strained quantum well structure, a p-type cladding layer 14 of p-type $(Al_{X1}Ga_{1-X1})_{0.51}In_{0.49}P$, a protective layer 16 (50 nm-thick) made of p-type $Ga_{0.51}In_{0.49}P$, and a p-type contact layer 17 (0.4 µm-thick) made of p-type GaAs.

In this structure, the p-type cladding layer 14 is provided with a ridge 14a in a mesa shape, and the p-type protective layer 16 and the p-type contact layer 17 are formed over the ridge 14a. In addition, a current block layer 15 (0.7 µm-thick) made of n-type AlInP is formed to cover the side wall of the ridge 14a and a portion of the p-type cladding layer 14 other than the ridge 14a. Note that the width of the bottom of the ridge 14a is defined as Wa.

In this structure, in the p-type cladding layer 14, the distance from the top end of the ridge 14a to the active layer 13 is set at 1.4 µm, and the distance from the bottom end of the ridge 14a to the active layer 13 is set at dp (0.2 µm).

Figure 1B:
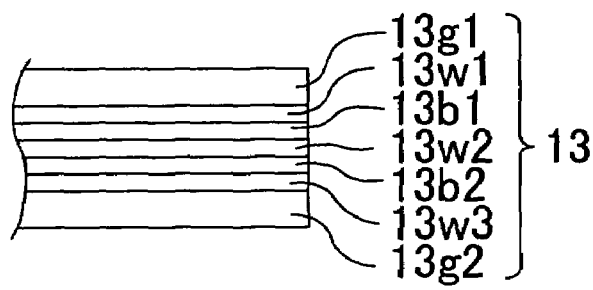
FIGS. 1B and 1C are views showing stacked structures of active layers 13 and 23, respectively.

The active layer 13 is a strained quantum well active layer, and has a structure as shown in FIG. 1B. Specifically, it has the structure made by stacking: three well layers 13w1, 13w2, and 13w3 each made of GaInP; two barrier layers 13b1 and 13b2 (5 nm-thick each) each made of $(Al_{0.5}Ga_{0.5})_{0.51}In_{0.49}P$ and each interposed between the corresponding well layers; and a first guide layer 13g1 (20 nm-thick) of $(Al_{0.5}Ga_{0.5})_{0.51}In_{0.49}P$ and a second guide layer 13g2 (20 nm-thick) of $(Al_{0.5}Ga_{0.5})_{0.51}In_{0.49}P$ which vertically interpose those five layers.

In this structure, a current injected from the p-type contact layer 17 is narrowed by the current block layer 15 to pass only the ridge 14a, which leads to current injection concentrated on a portion of the active layer 13 located below the ridge 14a. As a result of this, carrier population inversion necessary for laser oscillation is attained by a small injected current of about several tens of milliamperes.

Of the light emitted by recombination of carriers injected into the active layer 13, the light in the perpendicular direction to the active layer 13 is confined by the n-type cladding layer 12 and the p-type cladding layer 14. Simultaneously with this, the light in the horizontal direction to the active layer 13 is confined resulting from the fact that the current block layer 15 has a lower refractive index than the n-type cladding layer 12 and the p-type cladding layer 14.

Since the current block layer 15 is transparent to laser oscillation light, it absorbs no light and thus can provide a low-loss waveguide. Furthermore, since the distribution of light propagating through the waveguide can expand greatly into the current block layer 15, Δn of the orders of $10^{-3}$, which is the refractive index difference suited to high output operation, can be produced easily. Moreover, Δn can also be controlled to the order of $10^{-3}$ by controlling the value of dp.

As is apparent from the above, the red-light laser A serves as a high output semiconductor laser which can control the optical field distribution precisely and has a low operating current.

In the red-light laser A, the width Wa of the bottom of the ridge 14a has to be set at 3.7 µm or smaller in order to reduce higher-order transverse mode oscillation. However, reduction of the width Wa in turn leads to reduction of the width of the top surface of the ridge 14a according to the mesa shape. If the width of the top surface of the ridge 14a is reduced to a too small value, the differential resistance Rs increases to impair the overlapping capability of high-frequency current and the high-speed modulation characteristic of the optical output and also to increase the operating current, which will cause heat generation. Therefore, it is better that the width Wa of the ridge 14a is set at 1 µm or more. Note that generally, for a light source of a high-speed DVD system operating at 8× or higher speed, Rs of 5 Ω or lower is required.

Next description will be made of the infrared-light laser B. The infrared-light laser B has the same structure as the red-light laser A other than the structure of the active layer, and operates in the same manner other than the wavelength to be emitted. The details of this will be described below.

The infrared-light laser B has the structure made by sequentially stacking, on the n-type GaAs substrate 10 with the red-light laser A also present thereon in the following order from bottom to top, an n-type buffer layer 21 (0.5 µm-thick) made of n-type GaAs, an n-type cladding layer 22 (2.0 µm-thick) made of n-type $(Al_{X4}Ga_{1-X4})_{0.51}In_{0.49}P$, an active layer 23 with a strained quantum well structure, a p-type cladding layer 24 made of p-type $(Al_{X3}Ga_{1-X3})_{0.51}In_{0.49}P$, a protective layer 26 (50 nm-thick) made of p-type $Ga_{0.51}In_{0.49}P$, and a p-type contact layer 27 (0.4 µm-thick) made of p-type GaAs.

In this structure, the p-type cladding layer 24 is also provided with a ridge 24a in a mesa shape, and the p-type protective layer 26 and the p-type contact layer 27 are formed over the ridge 24a. In addition, a current block layer 25 (0.7 µm-thick) made of n-type AlInP is formed to cover the side wall of the ridge 24a and a portion of the p-type cladding layer 24 other than the ridge 24a. Note that the width of the bottom of the ridge 24a is defined as Wb.

In this structure, in the p-type cladding layer 24, the distance from the top end of the ridge 24a to the active layer 23 is set at 1.4 µm, and the distance from the bottom end of the ridge 24a to the active layer 23 is set at dp (0.24 µm).

Figure 1C:
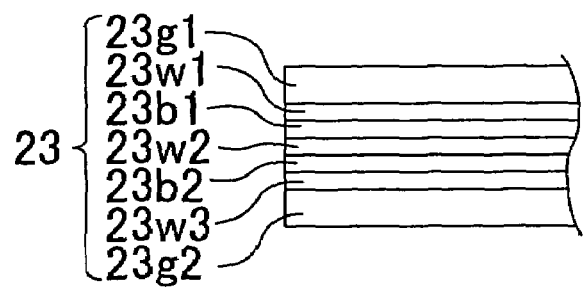

The active layer 23 is a quantum well active layer, and has a structure shown in FIG. 1C. Specifically, it has the structure made by stacking: three well layers 23w1, 23w2, and 23w3 each made of GaAs; two barrier layers 23b1 and 23b2 each made of $Al_{0.5}Ga_{0.5}As$ and each interposed between the corresponding well layers; and a first guide layer 23g1 (20 nm-thick) of $Al_{0.5}Ga_{0.5}As$ and a second guide layer 23g2 (20 nm-thick) of $Al_{0.5}Ga_{0.5}As$ which vertically interpose those five layers.

As in the case of the red-light laser A, in this structure, a current injected from the p-type contact layer 27 is narrowed by the n-type current block layer 25 to pass only the ridge 24a, which leads to current injection concentrated on a portion of the active layer 23 located below the ridge 24a. Therefore, carrier population inversion necessary for laser oscillation is attained by a small injected current of about several tens of milliamperes.

Confinement of light produced by recombination of carriers injected into the active layer 23 is also made in the same way as the red-light laser A. To be more specific, light confinement in the perpendicular direction to the active layer 23 is made by the n-type cladding layer 22 and the p-type cladding layer 24. Simultaneously with this, light confinement in the horizontal direction to the active layer 23 is made resulting from the fact that the current block layer 25 has a lower refractive index than the n-type cladding layer 22 and the p-type cladding layer 24.

Since the current block layer 25 is also transparent to laser oscillation light, it absorbs no light and thus can provide a low-loss waveguide. Furthermore, like the red-light laser A, since the distribution of light propagating through the waveguide can expand into the current block layer 25, $\Delta n$ of the orders of $10^{-3}$ suited to high output operation can be produced easily. Moreover, $\Delta n$ can also be controlled to the order of $10^{-3}$ by control of dp.

As is apparent from the above, the infrared-light laser B serves as a high output semiconductor laser which can control the optical field distribution precisely and has a low operating current.

In the infrared-light laser B, the width Wb of the bottom of the ridge 24a has to be set at 4.0 µm or smaller in order to reduce higher order transverse mode oscillation. However, when the width Wb is reduced, the differential resistance Rs increases to impair the overlapping capability of high-frequency current and the high-speed modulation characteristic of the optical output and also to increase the operating current, which will cause heat generation, as in the case of the red-light laser A. Therefore, it is better that the width Wb is set at 1 µm or more. Note that also like the red-light laser A, in order to use this device for a light source of a high-speed DVD system operating at 8× or higher speed, Rs of 5 Ω or lower is required.

In addition, for example, in order to reduce a leakage current in high temperature operation at 80° C., a high output laser providing 300 mW or higher has the length of a resonator set at 1500 µm or more to reduce the operating current density. In the case of this embodiment, the resonator length is 1750 µm.

Although not particularly shown, in both of the red-light laser A and the infrared-light laser B, the front and back end faces of the resonator are formed with an antireflection coating film with a reflectivity of 7% and a high reflection coating film with a reflectivity of 94%, respectively.

Figure 2:
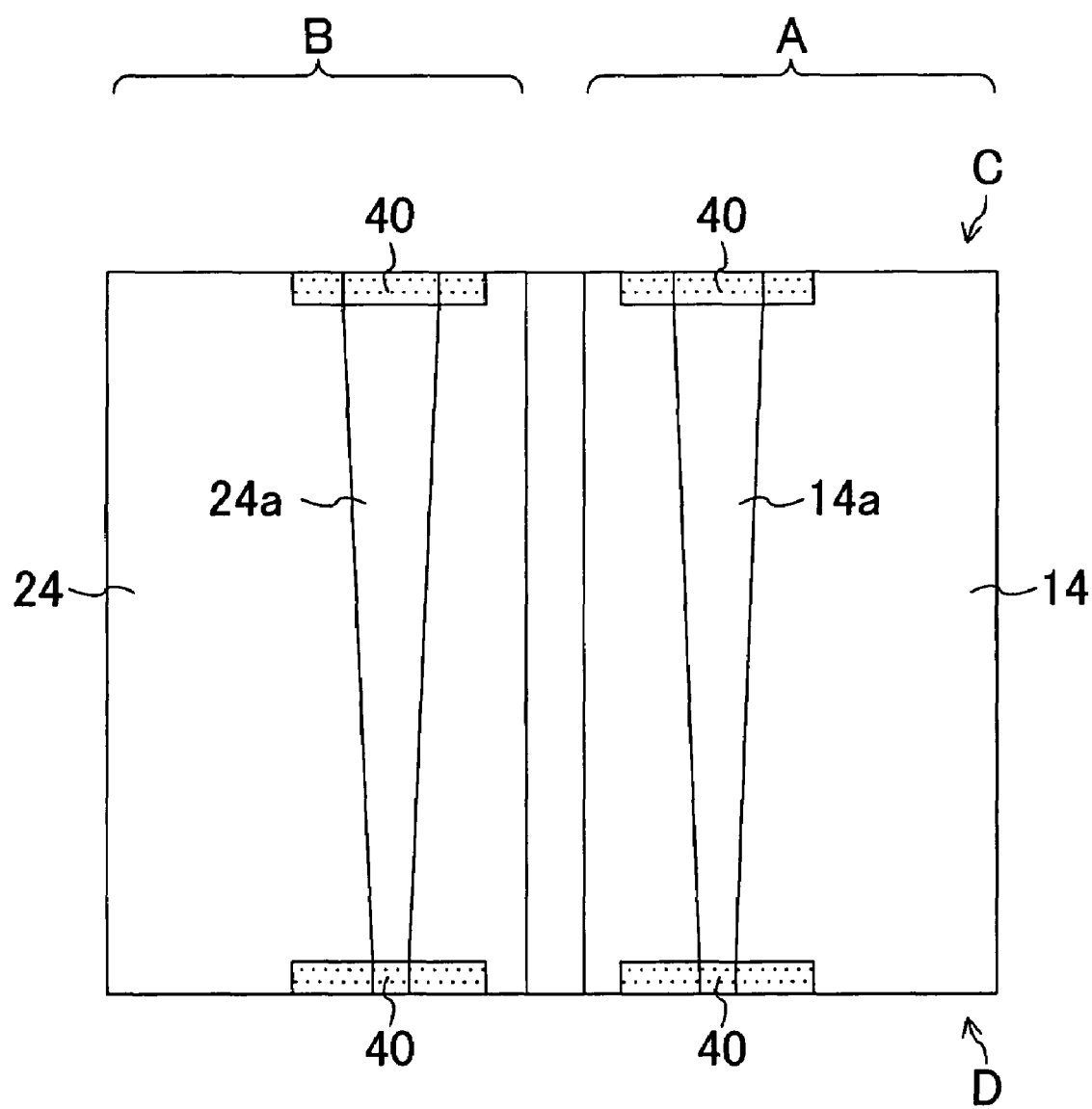
FIG. 2 is a view showing a plan structure of the semiconductor laser device according to one embodiment of the present invention, in particular the shapes of ridges and window regions.

Next, the plan structure of the semiconductor laser device 1 will be described with reference to FIG. 2. In FIG. 2, it is conceivable that this figure shows the shapes of the ridge 14a of the red-light laser A and the ridge 24a of the infrared-light laser B and also the shapes of the p-type cladding layers 14 and 24. The side face shown by C is the front end face from which light is emitted, and the opposite side face shown by D is the back end face.

Furthermore, in the active layer 13 and the active layer 23 contained in the respective light-emission portions, the both end faces of the resonator is subjected to impurity diffusion using Zn as an impurity to form window regions 40 in disordered states, respectively.

The band gap energy of the window region 40 is higher than that of the gain portion, and the window region 40 is transparent to laser oscillation light. As a result of this, even in laser operation during which heat generation reduces the band gap energy of a portion of the active layer located around the end face, the window region 40 can be kept in a transparent state to laser light to be emitted.

Thus, like the window region 40, by providing a window region at an end face, the occurrence of COD is suppressed to operate the device until the optical output is thermally saturated.

In this structure, the length of the window region (the size of the resonator in the length direction) is set at a sufficient value in consideration of variations and the like depending on the accuracies of element separation by cleavage and mask alignment for window region formation. To be more specific, preferably, this length is at least about 10 µm. In the case of this embodiment, the both window regions 40 have a length of about 20 µm.

Herein, the case where the semiconductor laser device is employed in, for example, an optical disk system operating at a high speed more than 8× speed is considered. Such laser device is required to improve the efficiency at which laser light emitted from the laser end face is taken in the lens. In order to improve the light transmission efficiency as shown above, it is better to provide a narrower full width at half maximum (angle of perpendicular divergence) of FFP of the light-emission portion in the perpendicular direction to the active layer.

However, if the angle of perpendicular divergence becomes too small, the optical field distribution (Near Field Pattern: NFP) propagating through the waveguide contrarily needs to be expanded greatly. When NFP expands greatly, the spot size of laser light condensed by the lens is increased contrarily to narrowed FFP. When the spot size increases, the possibility of reading information in an adjacent track is increased. That is to say, too much narrowing of the FFP pattern is also practically undesirable.

As is apparent from the above, in order to improve the transmission efficiency of light taken in the lens and decrease the spot size of laser light to be condensed onto the surface of an optical disk, the perpendicular FFP pattern should fall within an appropriate range. To be more specific, the angle of perpendicular divergence (obtained by the full width at half maximum) is desirably from 15° to 19° inclusive. The fact that the semiconductor laser device of this embodiment satisfies this condition will be described later.

Next description will be made of the Al composition of each of the cladding layers of the semiconductor laser device thus constructed according to this embodiment. The concrete cladding layers are: the n-type cladding layer 12 of n-type $(Al_{X2}Ga_{1-X2})_{0.51}In_{0.49}P$ and the p-type cladding layer 14 of p-type $(Al_{X1}Ga_{1-X2})_{0.51}In_{0.49}P$ contained in the red-light laser A; and the n-type cladding layer 22 of n-type $(Al_{X4}Ga_{1-X4})_{0.51}In_{0.49}P$ and the p-type cladding layer 24 of p-type $(Al_{X4}Ga_{1-X4})_{0.51}In_{0.49}P$ contained in the infrared-light laser B.

In each of the cladding layers 14, 12, 24, and 22, the Al:Ga ratios are represented as X1:1-X1, X2:1-X2, X3:1-X3, and X4:1-X4, respectively.

In this embodiment, by adjusting the relation among X1, X2, X3, and X4 which are parameters representing the Al contents of the cladding layers, at least the following three advantages are attained: (1) first, waveguide loss is reduced in both of the red-light laser A and the infrared-light laser B; (2) second, the full widths at half maximum of FFPs of the red-light laser A and the infrared-light laser B approach to come into nearly good agreement with each other; and (3) third, in the red-light laser A and the infrared-light laser B, simultaneous formation of the window regions and simultaneous formation of the ridges (14a and 24a) can be made at one respective process. These are attained in addition to improvement of the temperature characteristics of the semiconductor laser device.

First, waveguide loss in the red-light laser A will be described.

In general, it is known that in $(AlGa)_{0.51}In_{0.49}P$, the greater the Al content is, the smaller the refractive index becomes.

Thus, if X2 as the parameter representing the Al content of the n-type cladding layer 12 is greater than X1 as the like parameter of the p-type cladding layer 14, the refractive index of the n-type cladding layer 12 becomes smaller than that of the p-type cladding layer 14. Then, the resulting distribution of light emitted by the red-light laser A in the perpendicular direction to the active layer 13 has the shape tilted toward the p-type cladding layer 14 having the ridge 14a.

In this condition, the height of the ridge 14a is 1.4 µm, which is smaller than the thickness of the n-type cladding layer 12, that is, 2.0 µm. Therefore, the slope end of the optical field distribution located at the side of the ridge 14a spreads even to the protective layer 16 (50 nm-thick) provided on the ridge 14a, which facilitates the occurrence of light absorption loss. For such a situation, waveguide loss increases to in turn raise the operating current, so that the temperature characteristics of the element are degraded.

In order to prevent this trouble, it is sufficient that by setting X2 to have a value not more than X1, the refractive index of the n-type cladding layer 12 is prevented from having a smaller value than that of the p-type cladding layer 14. With this, the perpendicular optical field distribution has the shape slightly tilted toward the n-type cladding layer 12. Since the thickness of the n-type cladding layer 12 is 2.0 µm which is greater than the height of the ridge 14a, 1.4 µm, and the thickness of the portion of the p-type cladding layer 14 other than the ridge 14a, 0.2 µm, the slope end of the optical field distribution spreads to only a small area of the n-type buffer layer 11 below the n-type cladding layer 12. This results in reduction of the waveguide loss. Furthermore, when comparison is made between p-type semiconductor and n-type semiconductor, the p-type semiconductor is generally larger in free electron absorption loss. Also from this point, the optical field distribution can be tilted toward the n-type cladding layer 12 to reduce the light absorption loss caused to the optical field distribution propagating through the waveguide.

As described above, by employing $X1 \geq X2$, waveguide loss in the red-light laser A can be reduced. Moreover, from this point, it is more preferable to employ $X1 > X2$.

The reason why the height of the ridge 14a is made smaller than the thickness of the n-type cladding layer 12 is that if the ridge 14a for confining current is too thick, the element resistance rises. As another reason, in order to form a high ridge 14a, it is necessary to enhance the etching depth controllability.

Also in the infrared-light laser B, waveguide loss can be reduced in the same manner. To be more specific, by setting X3, which is the parameter representing the Al content of the p-type cladding layer 24, to have a value not more than X4 which is the like parameter of the n-type cladding layer 22, the refractive index of the p-type cladding layer 24 is made smaller than that of the n-type cladding layer 22. In other words, $X3 \geq X4$ is employed. Furthermore, from this point, it is more preferable to employ $X3 > X4$.

As a result of this, the distribution of light emitted by the infrared-light laser B in the perpendicular direction to the active layer 23 has the shape tilted toward the n-type cladding layer 22, and the thickness difference between the n-type cladding layer 22 and the p-type cladding layer 24 suppresses waveguide loss.

By thus reducing the waveguide loss, the operating current can also be reduced. This results in improvement of the temperature characteristics of the semiconductor laser device.

As described above, in the semiconductor laser device according to this embodiment, both of the red-light laser A and the infrared-light laser B attain reduced waveguide loss, high slope efficiency for the current-optical output characteristics, and excellent temperature characteristics.

In this embodiment, as one example, the parameters are set as follows: X1=0.7; X2=0.69; X3=0.7; and X4=0.67. Setting of these parameters will also be described later. Note that by thus setting the parameters, the angle of perpendicular divergence of the red-light laser A is 16.8°, which is a suitable value for a high-speed operable optical disk device.

Next, the relation between the red-light laser A and the infrared-light laser B will be described.

The well layers 13w1, 13w2, and 13w3 of the active layer 13 of the red-light laser A are made of GaInP, and the well layers 23w1, and 23w2, and 23w3 of the active layer 23 of the infrared-light laser B are made of GaAs.

The band gap of InGaP is wider than the band gap of GaAs. Thus, the band gap difference between the cladding layer (made of the AlGaInP-based material) and the well layer (made of GaAs) of the infrared-light laser B is greater than the band gap difference between the cladding layer (made of the AlGaInP-based material) and the well layer (made of GaInP) of the red-light laser A.

When from this fact, when consideration is made of the difference between the energy of quantum level of the conduction band in the well layer and the energy of the conduction band in the p-type cladding layer (referred to as a band offset and represented by ΔEc), the infrared-light laser B is greater in this difference than the red-light laser A. Therefore, the phenomenon in which carriers injected into the active layer are thermally excited and then leak into the p-type cladding layer, that is, carrier overflow has a smaller influence on the infrared-light laser B than on the red-light laser A.

This means the following fact: the infrared-light laser B has a smaller temperature dependence of the operating current and the oscillation threshold current than the red-light laser A, and thus it is a more excellent semiconductor laser in temperature property than the red-light laser A.

From this point, it is sufficient to design the device so that a high priority of the temperature property is given to the red-light laser A. To be more specific, in the red-light laser A, the Al content of the AlGaInP-based material forming the p-type cladding layer 14 is set so that the conduction band offset between the active layer 13 and the p-type cladding layer 14 is maximized to provide a good temperature property. To be more specific, the parameter X1 representing the Al content of the p-type cladding layer 14 is set at 0.7.

In this structure, in the red-light laser A and the infrared-light laser B, in order to carry out simultaneous formation of the window regions and simultaneous formation of the ridges (14a and 24a) at one respective process, the Al contents of the respective cladding layers desirably have closer values. This is because as the Al contents of the two cladding layers are closer, the process rates of the layers, such as an etching rate and impurity diffusion rate, are closer, thereby facilitating simultaneous formation. If such processes can be carried out simultaneously, fabrication processes are simplified to attain reduction in fabrication costs.

The window regions are formed so that the active layers 13 and 23 are made disordered by diffusing impurities therein to provide the layers with wider band gaps than the band gap energies of the original active layers. During this formation, impurity diffusion is performed from the sides of the p-type cladding layers 14 and 24 in both of the red-light laser A and the infrared-light laser B. Impurity diffusion is performed at a higher rate as the Al content thereof is higher, so that from this viewpoint, it is better to employ higher Al contents of the p-type cladding layers 14 and 24.

In the case where the semiconductor laser device is junction-down mounted, that is, in the case where the device is mounted so that the pn junction side of the device is located closer to the heat sink, in order to avoid causing strain resulting from mounting to the device, it is better that the ridge 14a of the red-light laser A and the ridge 24a of the infrared-light laser B have the same height. To provide this structure, no matter whether the etching for forming the ridges 14a and 24a is dry etching or wet etching, the etching rates of the layers are preferably equal. This is because such a condition can form the ridges 14a and 24a with the same height by etching for the same processing time.

To accomplish this situation, the parameters X1 and X3 representing the Al contents of the p-type cladding layer 14 and the p-type cladding layer 24 are desirably as close to the same value as possible. To be more specific, the absolute value of the difference between X1 and X3 is desirably 0.1 or smaller.

However, from the viewpoint of conforming the full widths at half maximum of the FFPs of the red-light laser A and the infrared-light laser B, desirably, X3 is slightly smaller than X1. The reason for this will be described below.

The AlGaInP-based material, for example, $(Al_{0.7}Ga_{0.3})_{0.51}In_{0.49}P$ has a refractive index of 3.24 with respect to a wavelength of 660 nm (red-light region) and a refractive index of 3.13 with respect to a wavelength of 780 nm (infrared region), so that the refractive index with respect to infrared region is smaller.

The material for the well of the active layer 13 of the red-light laser A, that is, InGaP has a refractive index of 3.45 with respect to a wavelength of 660 nm, while the material for the well of the active layer 23 of the infrared-light laser B, that is, GaAs has a refractive index of 3.63 with respect to a wavelength of 780 nm.

Therefore, if the cladding layers of the red-light laser A and the infrared-light laser B are made of (AlGa)InP with the same composition, the infrared-light laser B is greater in the refractive index difference between the active layer and the cladding layer when rough comparison therebetween is made.

As a result of this, when the cladding layers of the respective lasers are made of (AlGa)InP with the same composition, the angle of perpendicular divergence of the infrared-light laser B is larger than the angle of perpendicular divergence of the red-light laser A.

From this point, X3 is preferably smaller than X1, and in particular X3 larger than X1 should be avoided. That is to say, X1≧X3 is desired. Furthermore, from this point, X1>X3 is preferable. As is apparent from the above, the above-mentioned preferable relation regarding ridge formation and the like in which the absolute value of the difference between X1 and X3 is 0.1 or smaller means that X1−X3≦0.1 preferably holds.

In this embodiment, as described above, X1 is set at 0.7 for the purpose of keeping good temperature characteristics in the red-light laser A. In addition to this, in order to attain reduction of the difference in the full width at half maximum of FFP between the red-light laser A and the infrared-light laser B and also attain simultaneous formations of the ridges and the window regions, the parameter X3 representing the Al content of the p-type cladding layer 24 of the infrared-light laser B is set at 0.7, which is identical to X1.

Figure 3:
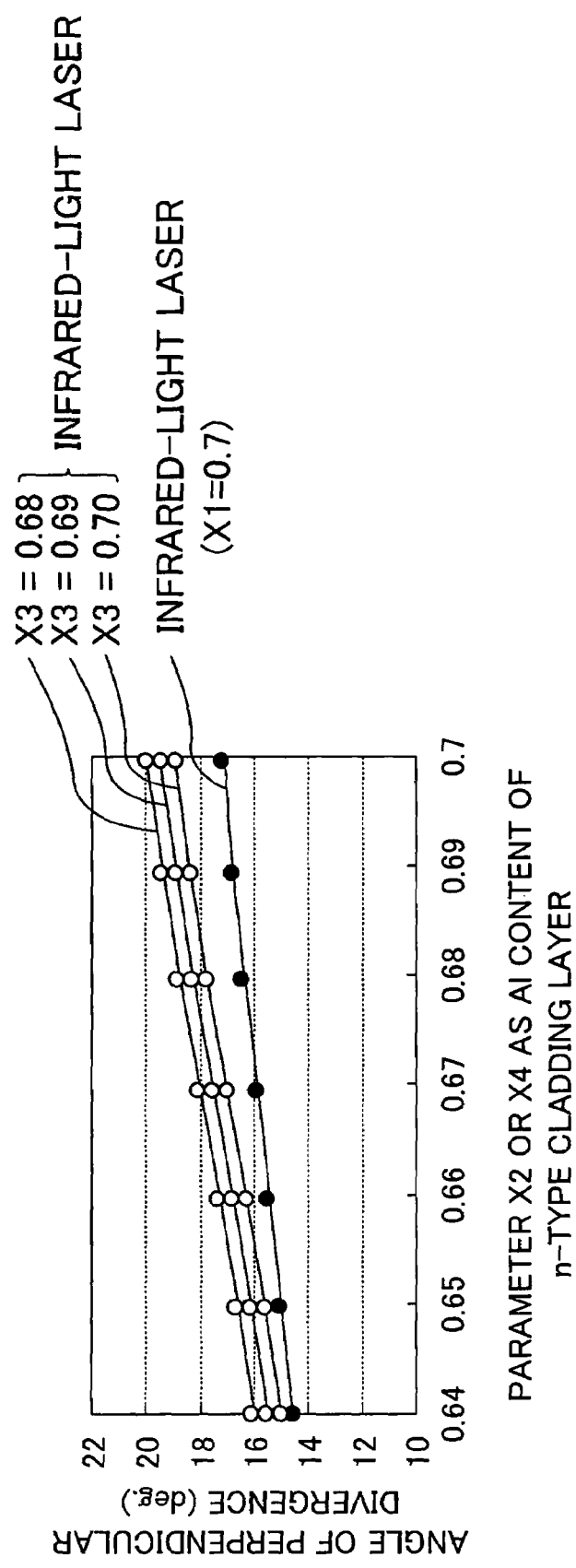
FIG. 3 is a graph showing the dependence of the angle of perpendicular divergence on the Al content of an n-type cladding layer obtained from a red-light laser A and an infrared-light laser B of the device according to one embodiment of the present invention.

Next, the parameter X4 representing the Al content of the n-type cladding layer 22 of the infrared-light laser B is considered. FIG. 3 shows the angles of perpendicular divergence by the red-light laser A and the infrared-light laser B. The shown result is obtained in room-temperature continuous oscillation operating at 5 mW.

To be more specific, the parameter X1 of the p-type cladding layer 14 of the red-light laser A is set at 0.7, and the parameter X2 representing the Al content of the n-type cladding layer 12 of n-type $(Al_{X2}Ga_{1-X2})_{0.51}In_{0.49}P$ is changed from 0.64 to 0.7. In this case, the result of measurement of the angle of perpendicular divergence of the red-light laser A is shown in FIG. 3 (by the plot by the filled circles).

FIG. 3 also shows the result of measurement of the angle of perpendicular divergence of the infrared-light laser B in the case where the parameter X4 representing the Al content of the n-type cladding layer 22 of n-type $(Al_{X4}Ga_{1-X4})_{0.51}In_{0.49}P$ is changed from 0.64 to 0.7. In this measurement result, the three-type measurement results are shown which are obtained by changing the parameter X3 representing the Al content of the p-type cladding layer 24 to 0.68, 0.69, and 0.70 (by the plots by open circles).

As shown in FIG. 3, when X2 and X4 are identical, the infrared-light laser B has a larger angle of perpendicular divergence. This is because if the cladding layers are formed of the AlGaInP-based material with the same composition as described previously, the infrared-light laser B is greater in the refractive index difference between the cladding layer and the active layer.

From this fact, in order to reduce the difference in the angle of perpendicular divergence between the red-light laser A and the infrared-light laser B and conform the both angles as close as possible, it is necessary to set X4 at a value not more than X2 for the purpose of reducing the refractive index difference. That is to say, it is required to satisfy X2≧X4. Moreover, it is better to set X4 at a value less than X2, that is, to satisfy X2>X4.

As described previously, in this embodiment, X1=0.7 and X2=0.69. Thereby, the angle of perpendicular divergence of the red-light laser A is 16.8. In order to set the angle of perpendicular divergence of the infrared-light laser B to be identical to 16.8°, in consideration of X3 already set at 0.7, it is sufficient to set X4 at 0.67 which is 0.03 smaller than 0.7. By this setting, the angle of perpendicular divergence of the infrared-light laser B becomes about 17°.

Note that the angles of horizontal divergence of the red-light laser A and the infrared-light laser B, represented as full width at half maximum of the FFP, are 9.0° and 9.2°, respectively, in operating at 5 mW, so that these angles are almost the same. This is accomplished by setting the distance dp from the bottom end of the ridge to the top surface of the active layer.

Figure 4A:
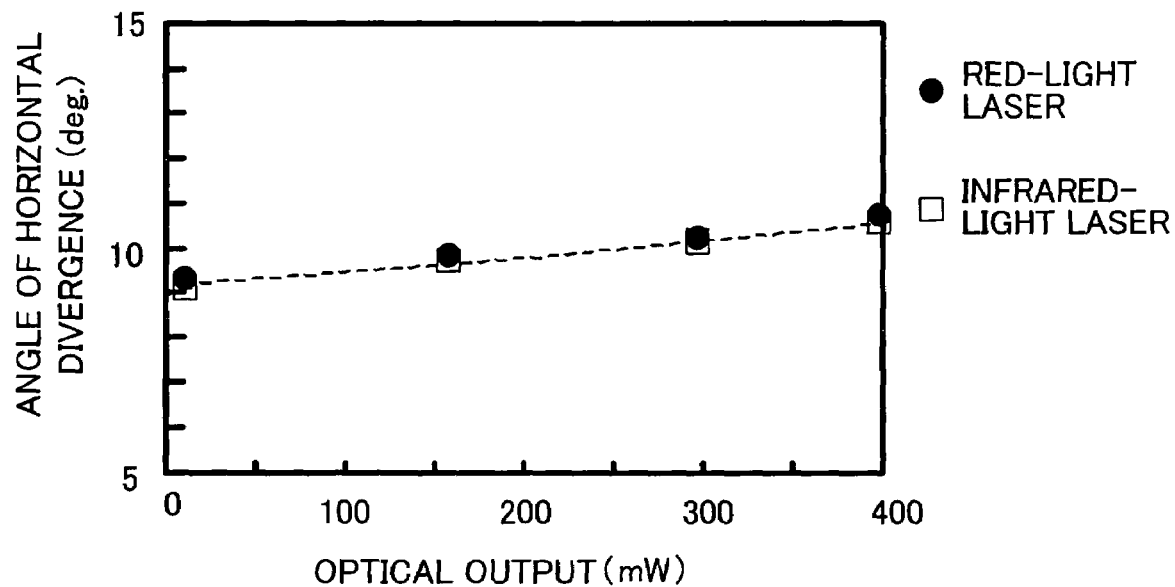
FIGS. 4A and 4B are graphs showing the dependences of the angles of horizontal and perpendicular divergences on the optical output, respectively, obtained from the red-light laser A and the infrared-light laser B of the device according to one embodiment of the present invention.
Figure 4B:
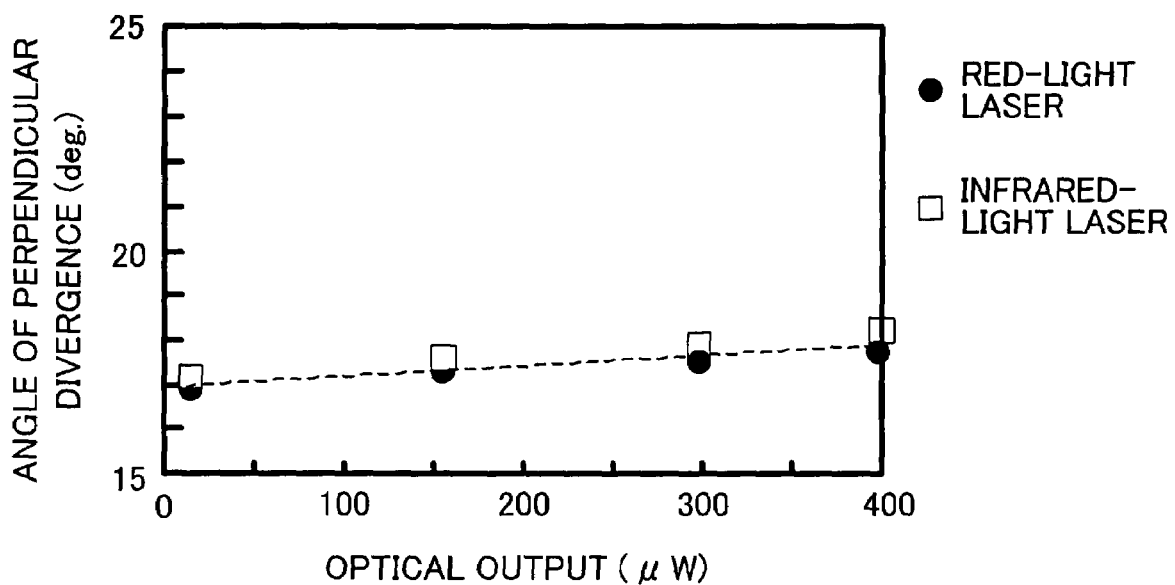

FIGS. 4A and 4B show the angle of horizontal divergence and the angle of perpendicular divergence of the semiconductor laser device according to this embodiment in room-temperature continuous-wave operation. In these figures, the result from the red-light laser A is shown by the filled circles, while the result from the infrared-light laser B is shown in the open squares.

From these results, it is found that both of the red-light laser A and the infrared-light laser B maintain nearly constant full widths at half maximum of FFPs throughout low-output operation to high-output operation at 400 mW and perform fundamental transverse mode oscillation. In addition, it is also found that the angles of perpendicular divergence of the red-light laser A and the infrared-light laser B are always in nearly good agreement.

When the dual-wavelength semiconductor laser device with such FFP characteristics is employed for a light source of a writable, readable optical disk system operating at high speed, optical design for an optical pickup is greatly facilitated.

Figure 5:
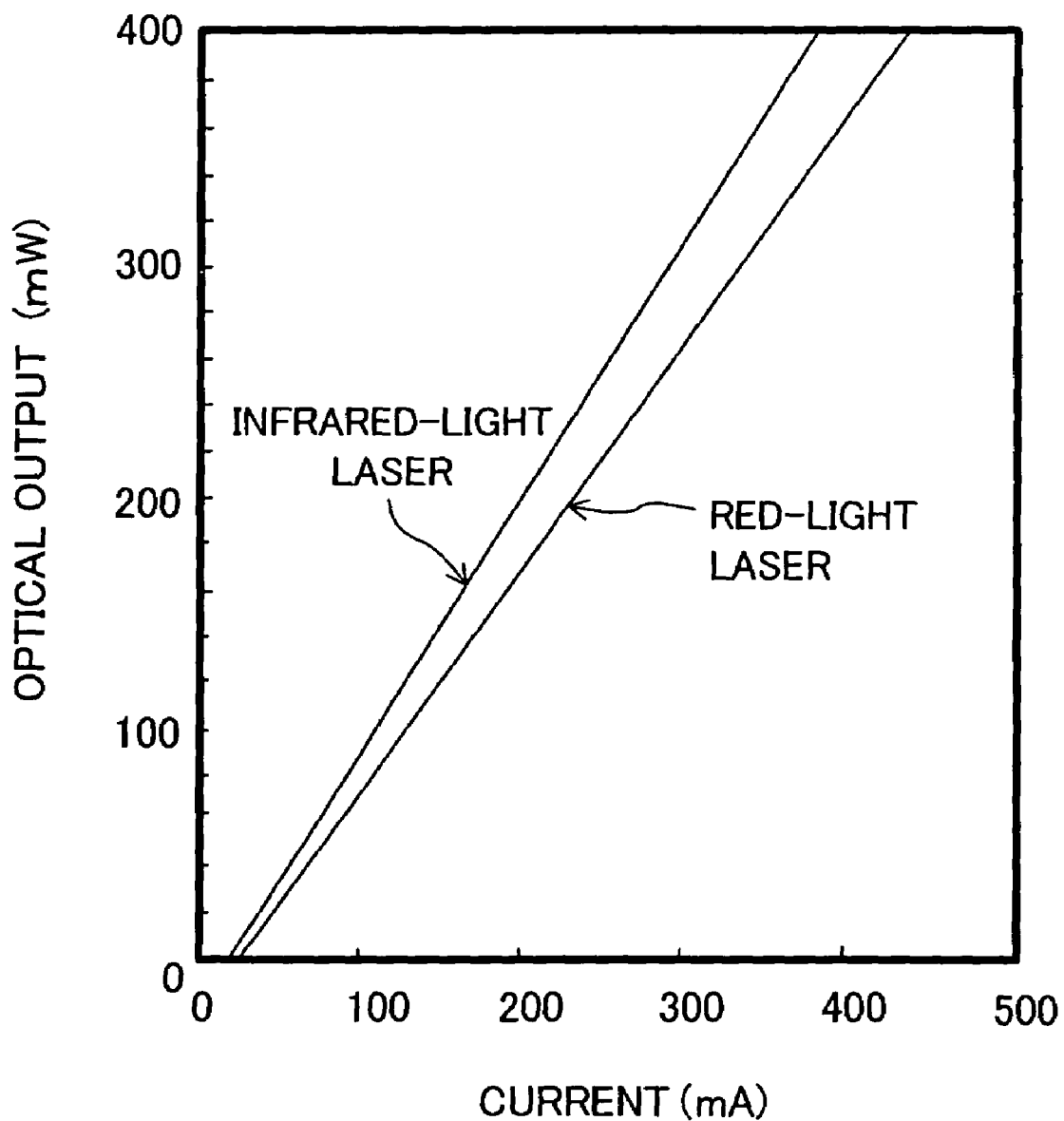
FIG. 5 is a graph showing the current-optical output characteristics of the red-light laser A and the infrared-light laser B of the device according to one embodiment of the present invention.

FIG. 5 shows the current-optical output dependence of the semiconductor laser device according to this embodiment in room-temperature continuous-wave operation. From FIG. 5, it is found that even in high output operation at 400 mW or more, no COD is caused to both of the red-light laser A and the infrared-light laser B. This results from the effect exerted by provision of the window region.

If the current block layers 15 and 25 are made of a dielectric material instead of n-type AlInP, not only the current blocking function but also the function of securing real refractive index guided mechanism can be carried out. This enables reduction of the operating current and the oscillation threshold current. Possible materials for forming a dielectric layer include a SiN film, a $SiO_2$ film, a $TiO_2$ film, an $Al_2O_3$ film, an amorphous silicon hydride film, and the like, and it is recommended that at least one of them is contained in the layer.

Next, a fabrication method of a semiconductor laser device identical to the semiconductor laser device 1 according to this embodiment will be described with reference to the accompanying drawings. FIGS. 6A to 6C, 7A to 7C, and 8A and 8B are views for explaining the method for fabricating a semiconductor laser device.

Figure 6A:
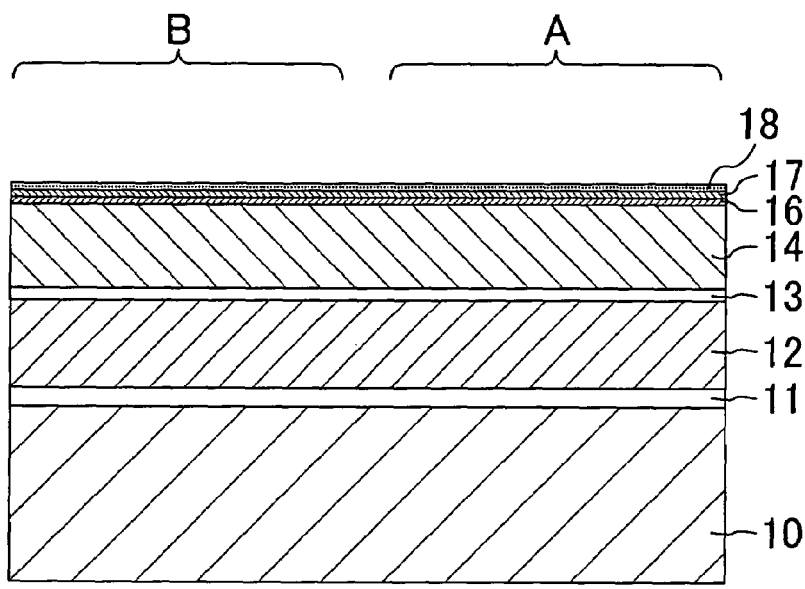
FIGS. 6A to 6C are views showing fabrication processes of a semiconductor laser device 1.

Referring to FIG. 6A, first, on the n-type GaAs substrate 10, the n-type buffer layer 11 (0.5 μm-thick) made of n-type GaAs, the n-type cladding layer 12 (2.0 μm-thick) made of n-type $(Al_{0.69}Ga_{0.31})_{0.51}In_{0.49}P$, the active layer 13 with a strained quantum well structure, the p-type cladding layer 14 of p-type $(Al_{0.7}Ga_{0.3})_{0.51}In_{0.49}P$, the protective layer 16 (50 nm-thick) made of p-type $Ga_{0.51}In_{0.49}P$, the p-type contact layer 17 (0.4 μm-thick) made of p-type GaAs, and a p-type boundary layer 18 (0.05 nm-thick) made of $Ga_{0.51}In_{0.49}P$ are stacked in this order from bottom to top. For this stacking, for example, respective crystal growths can be performed by a MOCVD (Metal Organic Chemical Vapor Phase Deposition) method or a MBE (Molecular Beam Epitaxy) method. In this method, the n-type GaAs substrate 10 is employed which uses as the principal plane a surface 10 degrees inclined from the (100) plane toward the [011] direction.

Note that specifically, the active layer 13 has the stacked structure as shown in FIG. 1B. It is sufficient that this structure is also formed by sequentially stacking, from bottom to top, the second guide layer 13g2, the well layer 13w3, the barrier layer 13b2, the well layer 13w2, the barrier layer 13b1, the well layer 13w1, and the first guide layer 13g1. Although in this embodiment, the active layer with the strained quantum well structure is used, a non-strained quantum well layer or a bulk active layer may be used. The conductivity type of the active layer may be either of p-type and n-type, and alternatively the active layer may be undoped.

Figure 6B:
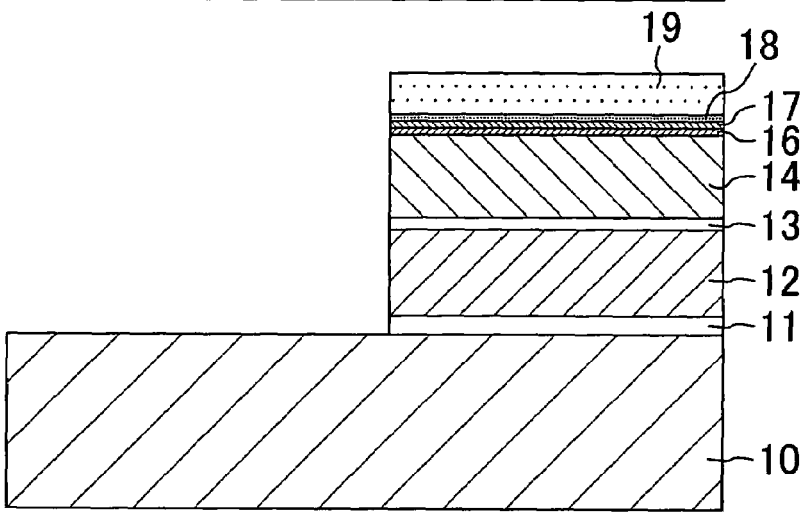

Subsequently, in the stacked structure shown in FIG. 6A, by photolithography, a photoresist pattern 19 is formed on the p-type boundary layer 18. Then, etching using this pattern as a mask is performed to remove, as shown in FIG. 6B, portions of the previously-stacked films from the n-type buffer layer 11 to the p-type boundary layer 18 which are not covered with the photoresist pattern 19. In this removal, as the etching solution, sulfuric acid-based or hydrochloric acid-based solution can be used.

Figure 6C:
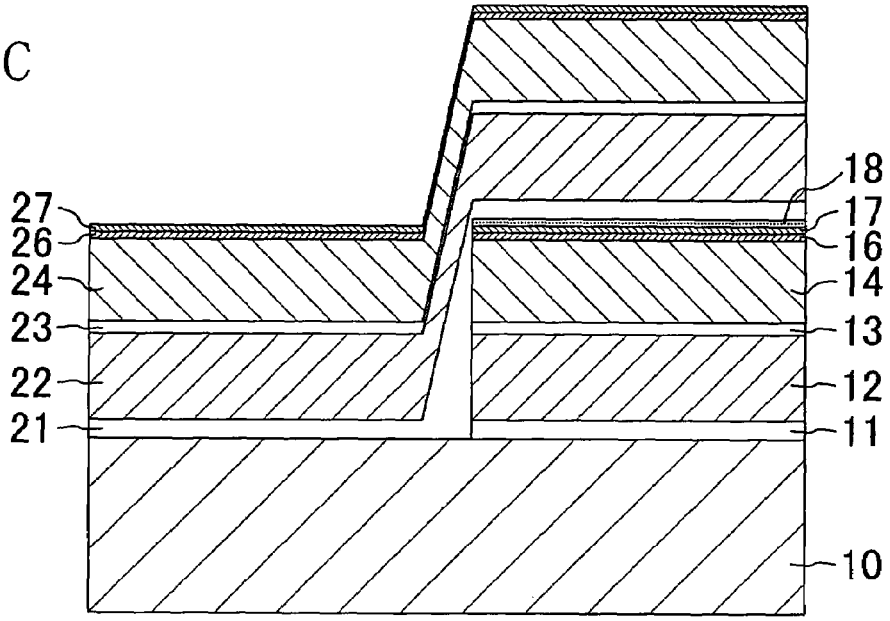

After removal of the photoresist pattern 19, as shown in FIG. 6C, the n-type buffer layer 21 (0.5 μm-thick) made of n-type GaAs, the n-type cladding layer 22 (2.0 μm-thick) made of n-type $(Al_{0.67}Ga_{0.33})_{0.51}In_{0.49}P$, the active layer 23 with a strained quantum well structure, the p-type cladding layer 24 made of p-type $(Al_{0.7}Ga_{0.3})_{0.51}In_{0.49}P$, the protective layer 26 (50 nm-thick) made of p-type $Ga_{0.51}In_{0.49}P$, and the p-type contact layer 27 (0.4 μm-thick) made of p-type GaAs are stacked using again a MOCVD method, a MBE method, or the like.

The active layer 23 has the stacked structure as shown in FIG. 1C. Similarly to the active layer 13, it is sufficient that this structure is also formed by sequentially stacking, from bottom to top, the second guide layer 23g2, the well layer 23w3, the barrier layer 23b2, the well layer 23w2, the barrier layer 23b1, the well layer 23w1, and the first guide layer 23g1.

Figure 7A:
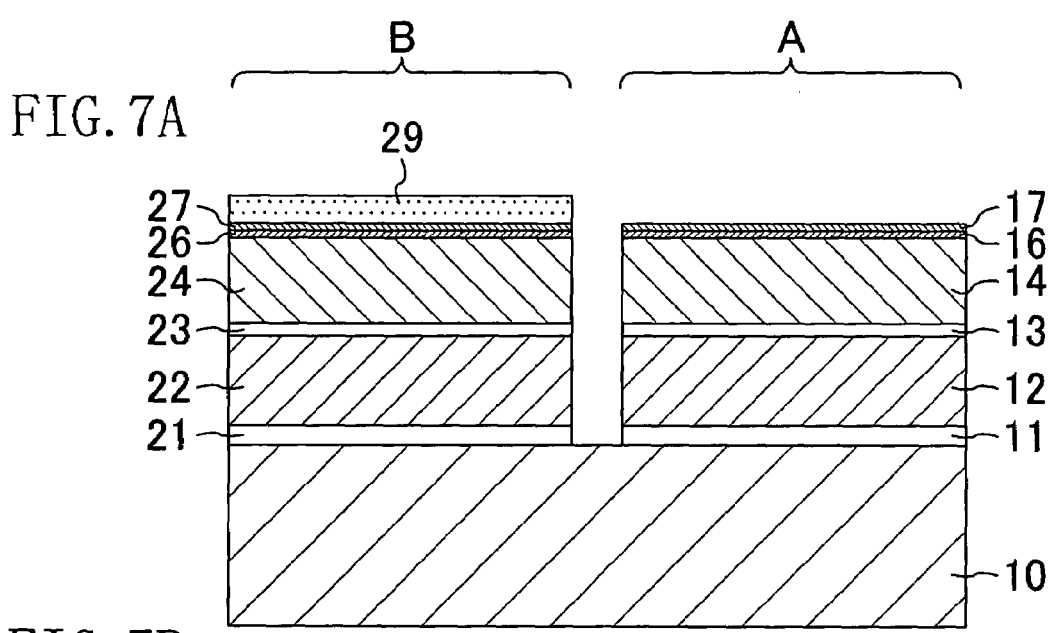
FIGS. 7A to 7C are views showing fabrication processes of the semiconductor laser device 1.

Next, as shown in FIG. 7A, a photoresist pattern 29 is formed by photolithography, and etching using the pattern as a mask is performed to remove portions of the stacked structure from the n-type buffer layer 21 to the p-type contact layer 27 which are not covered with the mask. Thereafter, the photoresist pattern 29 is removed.

Figure 7B:
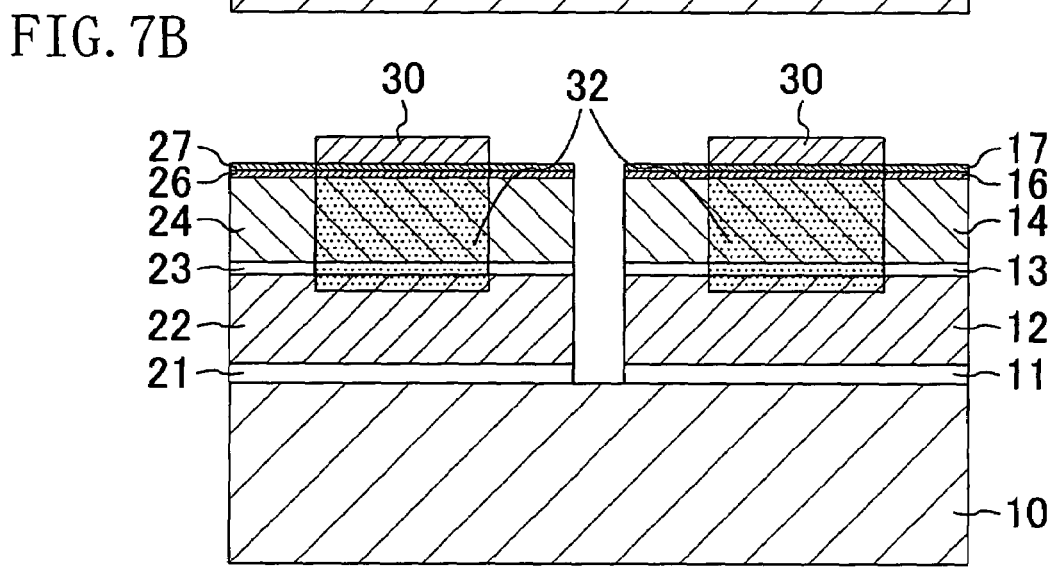

Subsequently, as shown in FIG. 7B, on the p-type contact layers 17 and 27, a 0.3 μm-thick Zn film is deposited by an atmosphere-pressure thermal CVD method (370° C.) or the like. Then, by photolithography and etching, the film is patterned into Zn diffusion sources 30.

Thereafter, Zn is thermally diffused from the Zn diffusion sources 30 to form Zn diffusion regions 32, respectively. After completion of the diffusion, the Zn diffusion sources 30 are removed. The Zn diffusion regions 32 will be formed into window regions (the window regions 40 in FIG. 2) located in the active layers 13 and 23, respectively, and in the red-light laser A and the infrared-light laser B, the Zn diffusion regions 32 are each disposed around at least one end face of the resonator. Zn diffusion makes the respective active layers in the disordered state, and thereby the window regions are formed.

In this structure, the p-type cladding layer 14 and the p-type cladding layer 24 are both made of $(Al_{0.7}Ga_{0.3})_{0.51}In_{0.49}P$, so that they have the same Al content. Thus, they have the same Zn diffusion rate, so that in the red-light laser A and the infrared-light laser B, Zn diffusion can be completed for the same period of time.

Figure 7C:
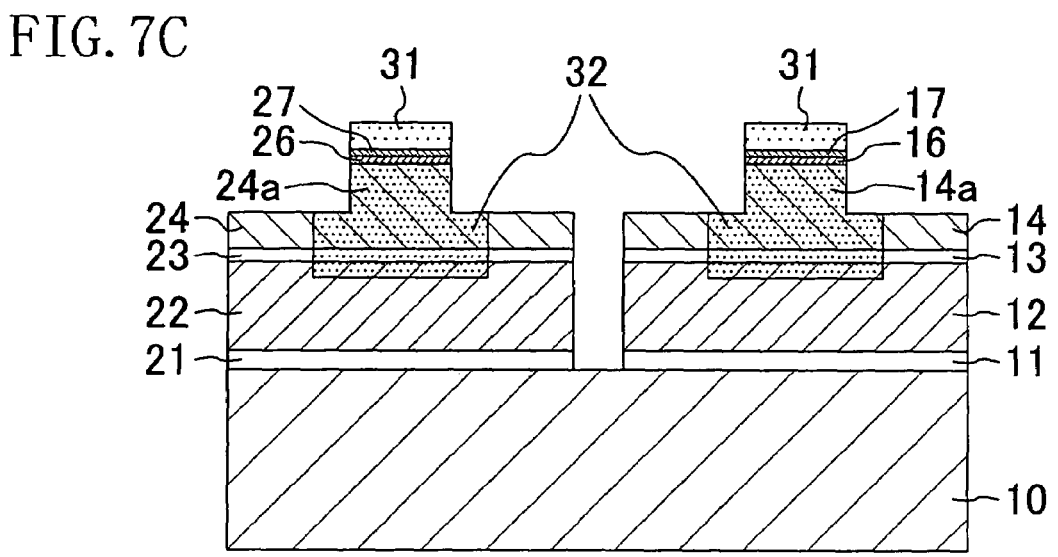
Figure 9:
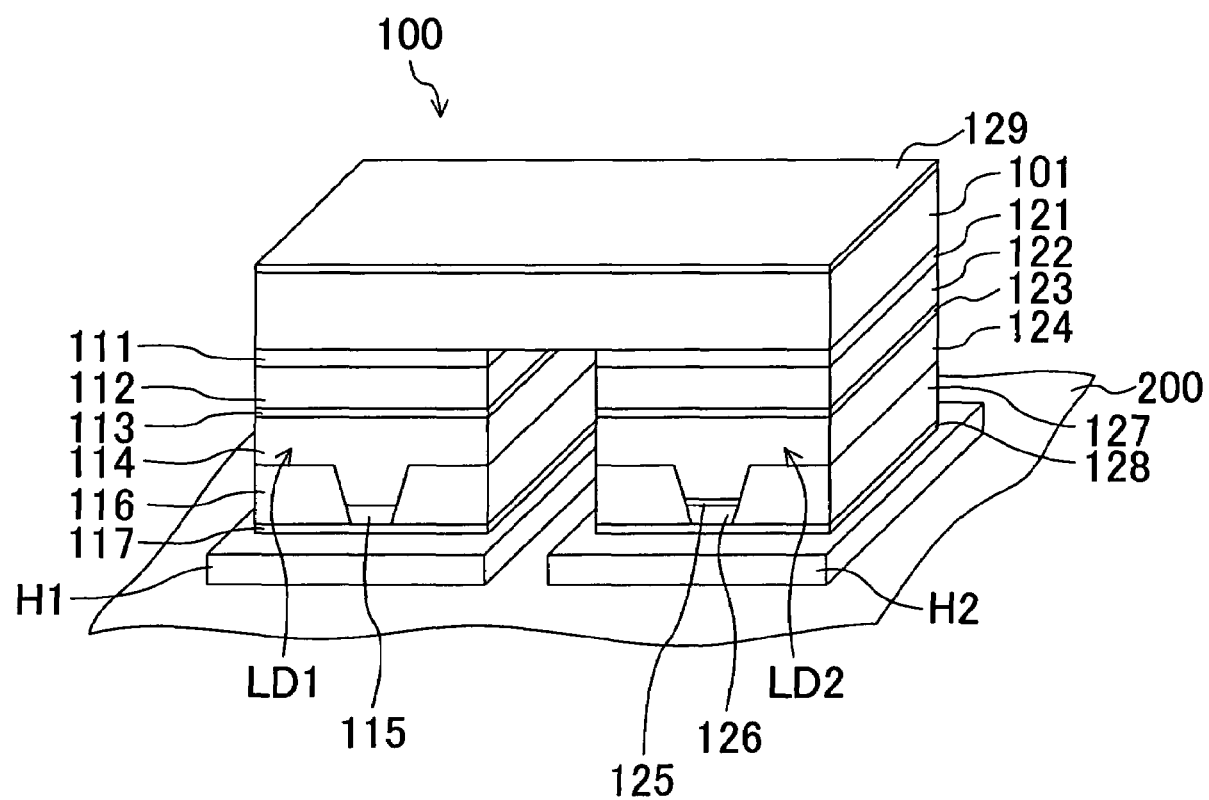
FIG. 9 is a view showing one example of a conventional semiconductor laser device.

As shown in FIG. 7C, by an atmosphere-pressure thermal CVD method (370° C.), a 0.3 μm-thick silicon oxide film is deposited on the p-type contact layers 17 and 27. Then, by photolithography and etching, the film is patterned to form striped masks 31.

Next, by etching using the striped masks 31 as a mask, selective etching is sequentially performed on the p-type contact layers 17 and 27, the p-type protective layers 16 and 26, and the p-type cladding layers 14 and 24, whereby the ridges 14a and 24a in mesa shapes are formed in the stacked structures with heterostructures, respectively. In this etching, portions of the p-type cladding layers 14 and 24 other than the ridges 14a and 24a are also left as thinner films than before etching.

In this structure, since the Al contents of the p-type cladding layers 14 and 24 are equal, the two layers have the same etching rate and thus etching of the layers can be completed for the same period of time.

Figures 8A, 8B:
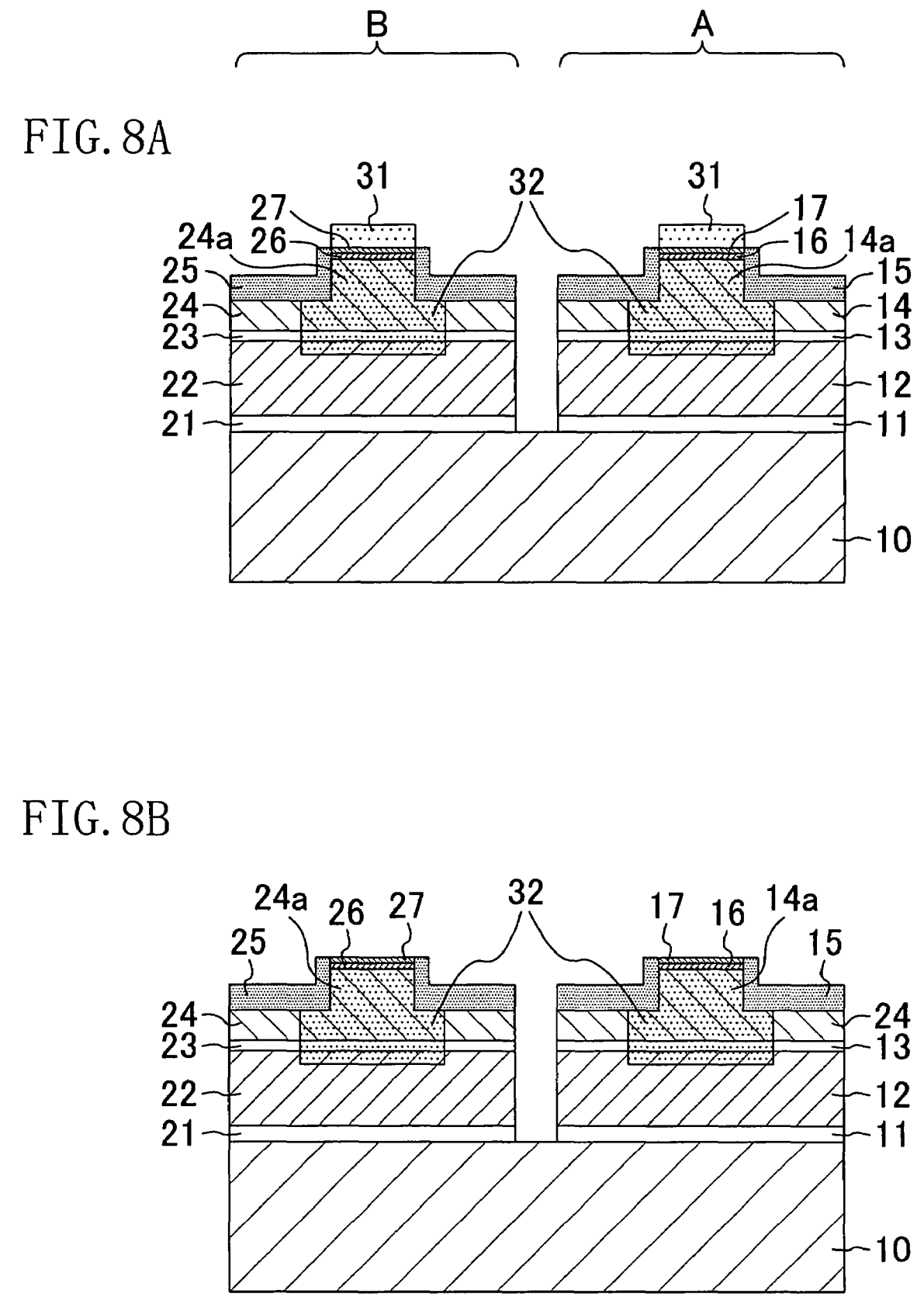

Subsequently, as shown in FIG. 8A, by a MOCVD method, a MBE method, or the like, the current block layers 15 and 25 of n-type AlInP are formed to cover side walls of the ridges 14a and 24a, remaining portions of the p-type cladding layers 14 and 24, and the like. In this process, since the striped masks 31 are left, the current block layers 15 and 25 are not formed on the p-type contact layers 17 and 27.

Thereafter, as shown in FIG. 8B, etching with hydrofluoric acid-based etching solution is performed to remove the striped masks 31.

In the case where the n-type current block layers 15 and 25 are each made of a dielectric layer, after the ridges 14a and 24a are formed as shown in FIG. 7C, the striped masks 31 are removed without forming the current block layers 15 and 25. Thereafter, a dielectric layer is formed on the entire surface, and by photolithography, a photoresist is patterned so that openings thereof are formed only above the p-type contact layers 17 and 27 over the ridges 14a and 24a. Then, using the photoresist as a mask, etching is performed with hydrofluoric acid-based chemical solution to remove portions of the dielectric layers located on the p-type contact layers 17 and 27.

Note that in order to secure the refractive index difference from the cladding layer, the dielectric film preferably contains at least one of SiN, $SiO_2$, $TiO_2$, $Al_2O_3$, and amorphous silicon hydride. The dielectric film may be formed of a stacked structure composed of films of these materials.

In the manner described above, the semiconductor laser device according to this embodiment is fabricated. However, all of the above-described materials, shapes, dimensions, and the like are merely illustrative, and the present invention is not limited to these. For example, the ratio between AlGa and In may be set at a value other than 0.51:0.49.

Such a semiconductor laser device can have FFPs of multiple light-emission portions which are in good agreement and can be fabricated at a low cost. Accordingly, it is also useful for a dual-wavelength semiconductor laser element in an optical disk system which uses a single optical system to provide a red laser light and an infrared laser light.

What is claimed is:

1. A semiconductor laser device,
    wherein in the device, a red-light-emission portion and an infrared-light-emission portion are provided on a single substrate,
    the red-light-emission portion has a double heterostructure in which a red-light-emitting active layer made of an InGaP-based material or an AlGaInP-based material is sandwiched by a first cladding layer made of an AlGaInP-based material of a first conductivity type and having a red-light-side striped portion for current injection and a second cladding layer made of an AlGaInP-based material of a second conductivity type,
    the infrared-light-emission portion has a double heterostructure in which an infrared-light-emitting active layer made of a GaAs-based material or an AlGaAs-based material is sandwiched by a third cladding layer made of an AlGaInP-based material of the first conductivity type and having an infrared-light-side striped portion for current injection and a fourth cladding layer made of an AlGaInP-based material of the second conductivity type,
    when in the first cladding layer, the second cladding layer, the third cladding layer, and the fourth cladding layer, the Al:Ga contents are represented by X1:1-X1, X2:1-X2, X3:1-X3, and X4:1-X4, respectively, X1>X2 and X3>X4 and X1−X3≦0.1 are satisfied,
    the red-light-emitting active layer and the infrared-light-emitting active layer each have a quantum well structure, and
    in at least one end face of a resonator contained in each of the red-light-emission portion and the infrared-light-emission portion, the red-light-emitting active layer and the infrared-light-emitting active layer are each provided with a window region in a disordered state made by impurity introduction of Zn as an impurity.

2. The device of claim 1, wherein X1>X3 and X2>X4 are further satisfied.

3. The device of claim 1, wherein the impurity further includes Si.

4. The device of claim 1,
    wherein the red-light-side striped portion and the infrared-light-side striped portion are formed of ridges in mesa shapes, respectively, and
    side walls of the ridges are formed with identical semiconductor layers, respectively.

5. The device of claim 4, wherein the semiconductor layers are AlInP current block layers.

6. The device of claim 4, wherein identical dielectric layers are formed instead of the identical semiconductor layers, respectively.

7. The device of claim 6, wherein the dielectric layers include at least one of a SiN layer, a $SiO_2$ layer, a $TiO_2$ layer, an $Al_2O_3$ layer, and an amorphous silicon hydride layer.

8. A method for fabricating a semiconductor laser device in which a red-light-emission portion and an infrared-light-emission portion are provided on a substrate, the method comprising:
    the step (a) of forming a double heterostructure of the red-light-emission portion in which a red-light-emitting active layer made of an InGaP-based material or an AlGaInP-based material is sandwiched by a first cladding layer made of an AlGaInP-based material of a first conductivity type and a second cladding layer made of an AlGaInP-based material of a second conductivity type;
    the step (b) of forming a double heterostructure of the infrared-light-emission portion in which an infrared-light-emitting active layer made of a GaAs-based material or an AlGaAs-based material is sandwiched by a third cladding layer made of an AlGaInP-based material of the first conductivity type and a fourth cladding layer made of an AlGaInP-based material of the second conductivity type;
    the step (c) of introducing, after the steps (a) and (b), Zn as an impurity into predetermined regions of the red-light-emitting active layer and the infrared-light-emitting active layer, thereby simultaneously forming window regions, respectively; and
    the step (d) of processing, after the steps (a) and (b), the first cladding layer and the third cladding layer to form a red-light-side striped portion and an infrared-light-side striped portion for current injection, respectively,
    wherein when in the first cladding layer, the second cladding layer, the third cladding layer, and the fourth cladding layer, the Al:Ga contents are represented by X1:1-X1, X2:1-X2, X3:1-X3, and X4:1-X4, respectively, X1>X2 and X3>X4 and X1−X3≦0.1 are satisfied.

9. The method of claim 8, wherein X1>X3 and X2>X4 are further satisfied.

* * * * *